(12) United States Patent
Cherniski et al.

(10) Patent No.: US 6,751,857 B2
(45) Date of Patent: Jun. 22, 2004

(54) CONDUCTIVE CONTAMINATION RELIABILITY SOLUTION FOR ASSEMBLING SUBSTRATES

(75) Inventors: Andrew Michael Cherniski, Rescue, CA (US); James Kristian Koch, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 09/824,506

(22) Filed: Apr. 2, 2001

(65) Prior Publication Data

US 2002/0139576 A1 Oct. 3, 2002

(51) Int. Cl.[7] .............................................. H05K 3/32
(52) U.S. Cl. .......................... 29/840; 29/832; 29/837; 29/739; 29/741; 29/839
(58) Field of Search ........................ 29/832, 837, 838, 29/839, 840, 739, 741

(56) References Cited

U.S. PATENT DOCUMENTS

| 4,586,607 | A | * | 5/1986 | Dubbs et al. ................ 206/716 |
| 6,330,745 | B1 | * | 12/2001 | Cromwell et al. ............ 29/832 |
| 6,360,432 | B1 | * | 3/2002 | Gupta ......................... 29/832 |

* cited by examiner

Primary Examiner—Richard Chang

(57) ABSTRACT

A method and apparatus to eliminate conductive contamination reliability problems for assembled substrates, such as electrical arcing in power semiconductor leads. One embodiment of the invention involves a method for assembling an electrical component having leads on a substrate having conductive contacts, wherein an elastomer part encapsulates the leads of the electrical component. A second embodiment of the invention involves assembling an electrical component having leads to a substrate having conductive contacts, wherein an elastomer shape cut by a punch die encapsulates the leads of the electrical component. A third embodiment of the invention involves an assembled substrate including an electrical component having leads, and an elastomer surrounding the leads to encapsulate the leads.

39 Claims, 9 Drawing Sheets

CONDUCTIVE CONTAMINATION RELIABILITY SOLUTION FOR ASSEMBLING SUBSTRATES

BACKGROUND OF THE INVENTION

1. Field of the Invention

This invention relates generally to improving the reliability of electrical components assembled on substrates, and more particularly to improving the reliability of electrical components, such as power semiconductors, in the presence of conductive contamination.

2. Description of the Prior Art

In many data processing systems (e.g., computer systems, programmable electronic systems, telecommunication switching systems, control systems, and so forth) electrical components (e.g., power semiconductors) are used in power units that supply hundreds or thousands of watts. Power factor correction is frequently required in such power units, and this is conventionally accomplished by inductively boosting the peak incoming line voltage above the peak voltage level seen on the power source. For example, in 240 volt alternating current (VAC) systems, 400 volts direct current (VDC) is routinely chosen as the boost potential. Electrical components, such as power semiconductors (e.g., field effect transistors and fast Schottkey diodes) provide efficient conversion to achieve such boost conversions.

The industry standard package styles for electrical components (e.g., power semiconductor devices, and other types of electronic devices) include several package styles (e.g., TO-220, TO-264, and TO-247). Such electrical components are typically encapsulated in a plastic body for through-hole lead attachment to a substrate. The body of an electrical component is frequently thermally coupled to a heat dissipation device (e.g., a heat sink, a heat-pipe, a fluid cooling system, a cooling fan, or other equivalent devices).

As more of these power units are shipped to customers, a serious reliability problem has emerged. Catastrophic failure involving electrical arcing (i.e., arc-over), and even fire in the power unit has become more common. The failure mode of the returned power units has been analyzed, and the source of failure has been found to be located in the electrical components (e.g., the power semiconductors). The initial source of failure and ignition is usually located in one of two places. Electrical arcing either occurs between adjacent leads of the power semiconductor packages where the leads connect to boost potentials, or the failure occurs between one of the leads and the heat dissipation device attached to the body of the power semiconductor. However, the spacing between adjacent leads or between any lead and the heat dissipation device is sufficiently large to withstand 400 volts of boost potential under normal conditions. The catalyst that initiates electrical arcing is the addition of conductive contaminants, such as "zinc whiskers" or other similar micro-conductors between adjacent leads or between a lead and the heat dissipation device.

Zinc whiskers are microscopic filaments of zinc metal that are prevalent wherever zinc plated metal is present. Zinc, being a sacrificial anode for steel, is used extensively as a plating layer wherever steel is used. Zinc can be found in air ducts, in cooling plenums used for cooling a data processing system, and even on the data processing system enclosure itself. Airborne zinc whiskers are plentiful wherever high air velocities are present. The same is true for other airborne metallic filaments, but zinc is more prevalent and more likely to form and sustain long filaments.

One of the reasons that power unit electrical arcing has become an increasingly serious reliability problem is that the airflows needed to keep these data processing systems cool are increasing as the power dissipation levels in data processing systems are increasing. The result is higher velocities of zinc-rich air across electrical components (e.g., power semiconductors) in need of cooling. These are the same electrical components most vulnerable to electrical arcing.

The process of electrical arcing begins with a tiny conductive path across a high potential (i.e., a high voltage). This requirement is satisfied with an accumulation of zinc whiskers joined with dust filaments on the leads of the power semiconductors or other electrical components. The result is a matrix of conductive material embedded in non-conductive dust. When a sufficiently small gap forms in the matrix, the 400 VDC boost potential will electrically arc across the gap. Zinc whiskers are generally not substantial enough to maintain the small gap necessary for 400 VDC to continue the electrical arcing. The tiny zinc whiskers rapidly vaporize, but in doing so, they ionize the surrounding air and provide a low impedance path in which the electrical arc is continued. The heat from the ion arc carbonizes the surround dust particles and/or the plastic semiconductor body, and provides a stable low impedance path resulting in a carbon flash. The resulting current spike destroys the nearest power semiconductor or other semiconductors, and causes the data processing system to fail.

Conventional solutions for this problem involve a variety of unattractive remedies, none of which is in widespread use. The most obvious conventional solution to reduce the electrical arcing is a new semiconductor design with much larger lead spacing. Unfortunately, this kind of packaging does not now exist, and would tax the power unit design with new constraints, such as increased size and more expensive heat dissipation device attachment. Furthermore, this approach would not eliminate the problem, but only reduce the severity and frequency of occurrence of the problem.

Another conventional solution is using a conformal coating on the substrate, such as a printed circuit board (PCB). A conformal coating normally includes dipping or spraying the substrate (e.g., a PCB) with an insulating paint or other polymer. While conformal coatings would solve the electrical arcing problem, the resulting assembly would be completely un-repairable and also un-recyclable. A conformal coating is not commonly applied to PCBs or other substrates produced in volume, because of the associated costs. The conformal coating process is expensive, and is also difficult to control on PCBs or other substrates assembled with connectors (e.g., connectors for cables).

An alternative conventional solution is a selective conformal coating, instead of a full conformal coating. A selective conformal coating typically involves a paste material selectively applied to the area of interest on a PCB or another substrate. In this case, the conformal coating covers the leads of the power semiconductors and other critical electrical components. While a selective conformal coating could be an effective solution for the described problem of electrical arcing, the application of a selective conformal coating is restricted to a manual, labor-intensive process. The possibility of misapplication resulting in incomplete coverage is substantial. Even in proper applications of a selective conformal coating, the process is time consuming, expensive, and messy.

It would be desirable to provide much of the protection of a fully conformal coating with a process that is inexpensive, manufacturing-friendly, and recyclable. What is needed is a consistent, particle-tight seal around each of the leads of electrical components (e.g., power semiconductors and other critical electrical components).

SUMMARY OF THE INVENTION

The present invention provides much of the protection of a fully conformal coating with a process that is inexpensive, manufacturing-friendly, and recyclable.

The invention also provides a consistent, particle-tight seal around each of the leads of electrical components (e.g., power semiconductors), where the seal extends from the body of the electrical component to the surface of the substrate (e.g., a PCB). The invention virtually eliminates particle contamination by airborne filaments between adjacent leads, and particle contamination by airborne filaments between a lead and a heat dissipation device.

A first aspect of the invention is directed to a method for assembling an electrical component having a plurality of leads on a substrate having a plurality of conductive contacts. The method includes installing an elastomer part on the leads on the electrical component to substantially encapsulate the leads, pushing the leads of the electrical component on the conductive contacts of the substrate, and bonding the leads of the electrical component to the conductive contacts to form electrical connections between the leads and the conductive contacts.

A second aspect of the invention is directed to a method for assembling an electrical component having leads to a substrate having conductive contacts. The method includes installing an elastomer shape cut by a punch die on the leads of the electrical component to substantially encapsulate the leads, pushing the leads of the electrical component on the conductive contacts of the substrate, and bonding the leads of the electrical component to the conductive contacts to form electrical connections between the leads and the conductive contacts.

A third aspect of the invention is directed to an assembled substrate. The assembled substrate includes a substrate having conductive contacts, an electrical component having leads, an elastomer surrounding the leads of the electrical component to substantially encapsulate the leads, and a bond between a corresponding lead of the electrical component and a corresponding conductive contact of the substrate form a plurality of electrical connections between the leads and the conductive contacts.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides much of the protection of full conformal coating with a process that is inexpensive, manufacturing-friendly, and recyclable. The invention also provides a consistent, particle-tight seal around each of the leads of a power semiconductor or other type of electrical component. The seal extends from the body of an electrical component (e.g., a power semiconductor) to the surface of a substrate, such as a printed circuit board (PCB). This seal eliminates particle contamination by airborne filaments between adjacent leads, as well as from a lead to a heat dissipation device. While the discussion below is directed to an application of the invention to power semiconductors assembled on a substrate (e.g., a PCB), the invention can also be applied to any type of electrical component assembled on any type of substrate (e.g., a multi-chip module, or another substrate upon which electrical components can be assembled).

Figure 1:
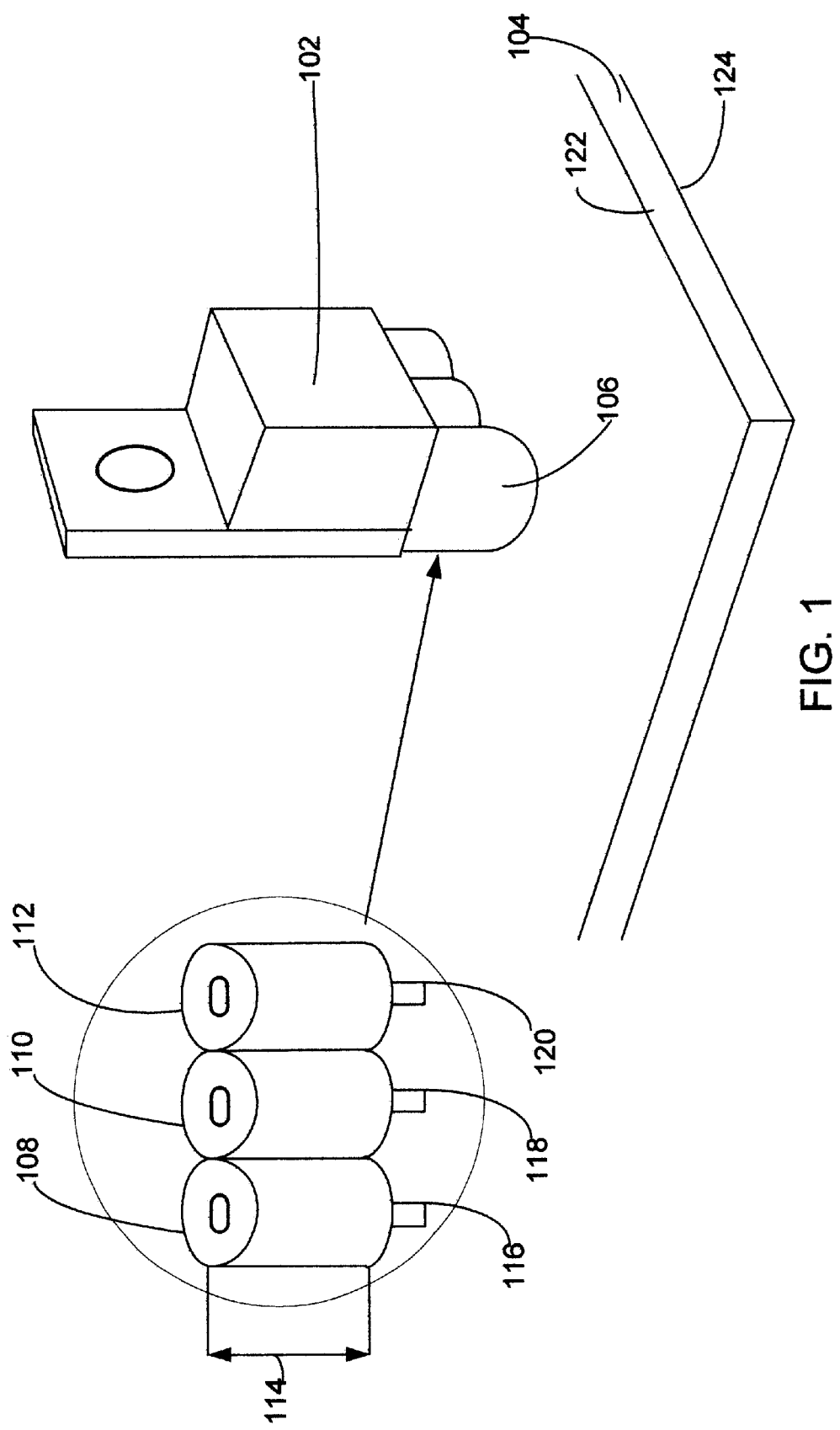
FIG. 1 illustrates one embodiment of the invention applied to an electrical component (e.g., a power semiconductor) that is perpendicularly placed on a substrate (e.g., a PCB).

FIG. 1 illustrates one embodiment of the invention applied to an electrical component 102 (e.g., a power semiconductor) that is perpendicularly placed (i.e., the plane of the leads are perpendicular to the plane of the substrate) on a substrate 104 (e.g., a PCB) having a top surface 122 and a bottom surface 124. Electrical component 102 includes an elastomer part 106 comprising a soft, compliant plastic (e.g., a compressible thermoplastic or thermosetting plastic), rubber (e.g., silicone rubber), or resin. Elastomer part 106 has a plurality of tubes (e.g., tubes 108, 110, and 112) of equal length 114, each joined to another tube along their length 114. The length 114 of the tubes 108, 110, and 112 is specified to be somewhat longer than the distance between the body of electrical component 102 and the substrate 104 into which the electrical component 102 is normally placed. When the elastomer part 106 is installed around the leads 116, 118, and 120 of electrical component 102 prior to placing the electrical component 102 on the substrate 104, the elastomer part 106 completely surrounds the leads 116, 118, and 120 from the electrical component 102. Only the portion of the leads 116, 118, and 120 that are destined for placement on the substrate 104 are exposed.

The electrical component 102 is pushed onto the substrate 104 in a conventional manner, except that some small additional force will be required to partially compress the elastomer part 106. The compression of the elastomer part 106 is necessary to provide a consistent particle tight seal at both the body of the electrical component 102 and at the top surface 122 of the substrate 104. A fixture (e.g., a clamp) connected to the substrate 104 can compress the elastomer part 106 during lead bonding.

Figure 2:
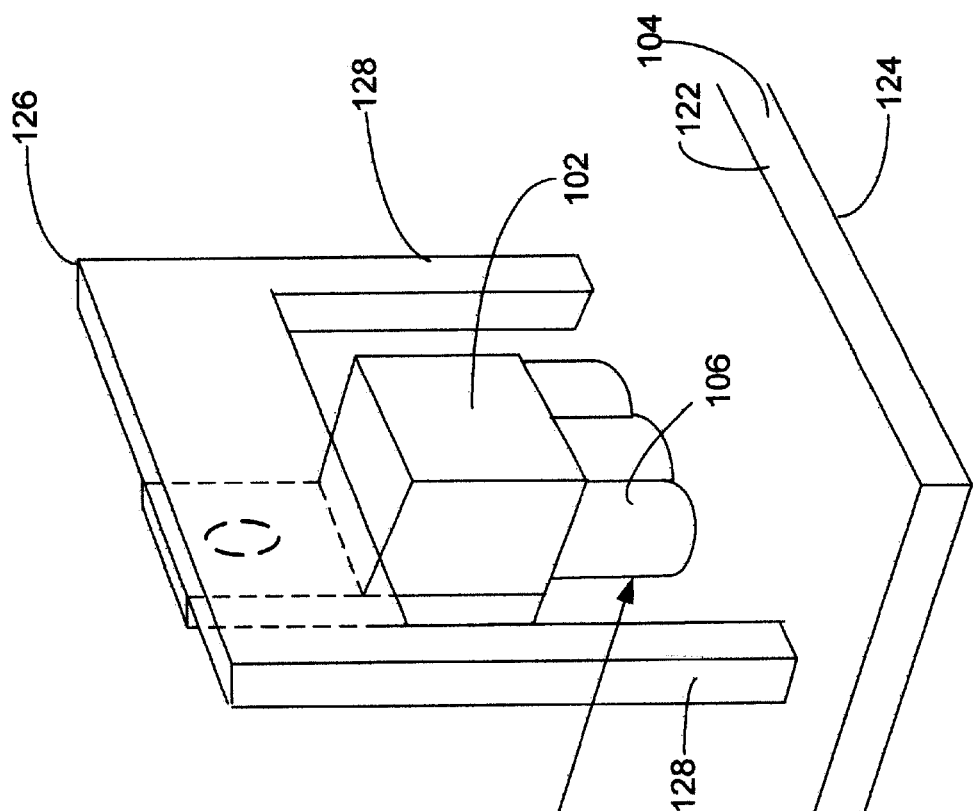
FIG. 2 illustrates an electrical component and a heat dissipation device that is installed onto the electrical component prior to placement on a substrate.
Figure 2:
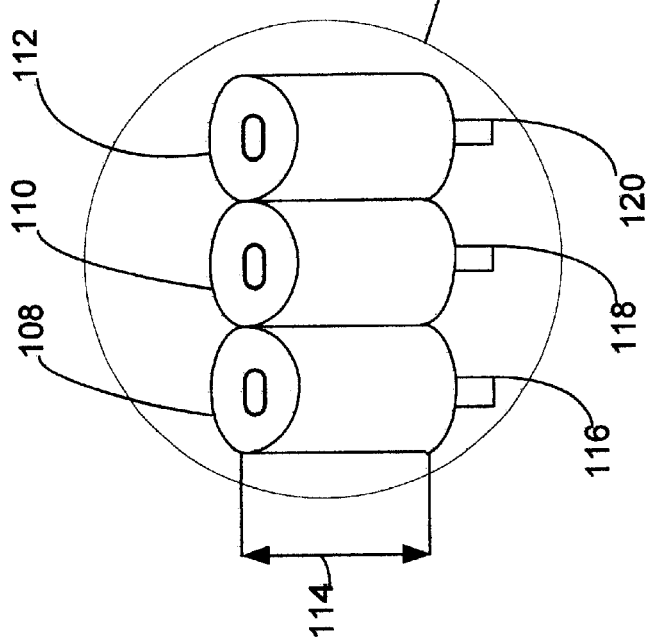

FIG. 2 illustrates an electrical component 102 and a heat dissipation device 126 that is installed onto the electrical component 102 prior to placement on a substrate 104. The heat dissipation device 126 usually has tabs 128 that protrude through the substrate 104 that are soldered at the same time as the leads 116, 118, and 120. The heat dissipation device 126 can be used as the fixture to compress the elastomer part 106 prior to soldering, and thereby eliminate the need for a fixture. Once the electrical component 102 and heat dissipation device 126 are soldered to the substrate 104, the leads 116, 118, and 120 (if the substrate 104 is a through-hole substrate) are trimmed flush to the bottom surface 124 of the substrate 104.

Figure 3:
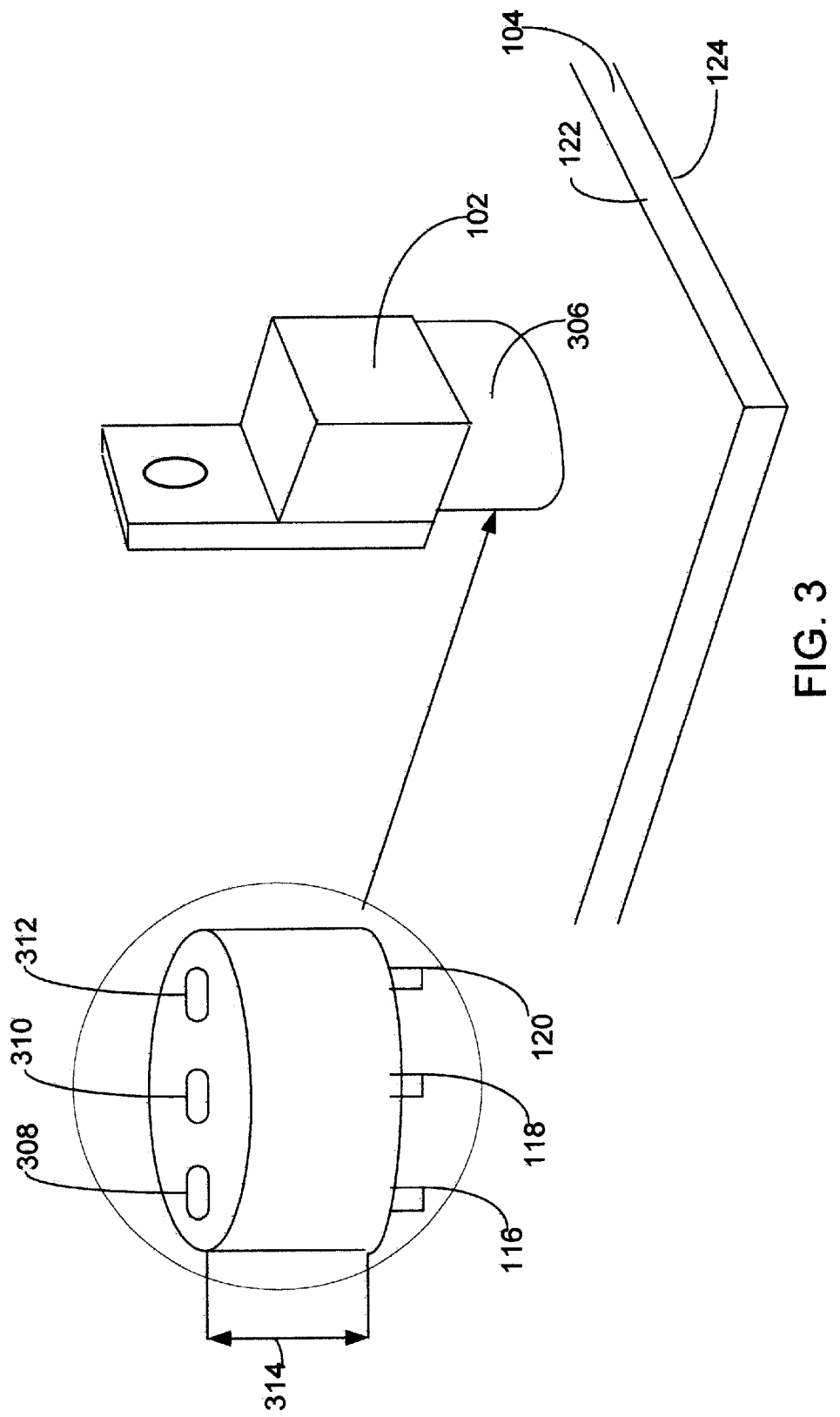
FIG. 3 illustrates a second embodiment of the invention using a an elastomer shape cut by a punch die installed on an electrical component (e.g., a power semiconductor) that is perpendicularly placed on a substrate having a top surface and a bottom surface.

FIG. 3 illustrates a second embodiment of the invention applied to an electrical component 102 (e.g., a power semiconductor) that is perpendicularly placed on a substrate 104 (e.g., a PCB) having a top surface 122 and a bottom surface 124. Electrical component 102 is connected to an elastomer shape 306 cut by a punch die from a substantially flat elastomer (e.g., a plate or sheet of compliant plastic or rubber, such as silicone rubber). The elastomer shape 306 is cut to have holes 308, 310, and 312 to fit the leads 116, 118, and 120 of electrical component 102 prior to placing the electrical component 102 on the substrate 104, and elastomer shape 306 completely surrounds the leads 116, 118, and 120 from the electrical component 102. The shape of the elastomer shape 306 can be an oval, a circle, a rectangle, or any other arbitrary shape sufficient to encapsulate the leads 116, 118, and 120 of the electrical component 102. The thickness 314 of the elastomer shape 306 is specified to be somewhat thicker than the distance between the body of electrical component 102 and the substrate 104 into which the electrical component 102 is normally placed. Only the portion of the leads 116, 118, and 120 that are necessary for contact on the substrate 104 are exposed.

The electrical component 102 is pushed onto the substrate 104 in a conventional manner, except that some small additional force may be required to partially compress the elastomer shape 306. The compression of the elastomer shape 306 is necessary to provide a consistent particle tight seal at both the body of the electrical component 102 and at the top surface 122 of the substrate 104. A fixture (e.g., a temporary clamping device connected to the substrate 104) may be needed to achieve this compression.

Figure 4:
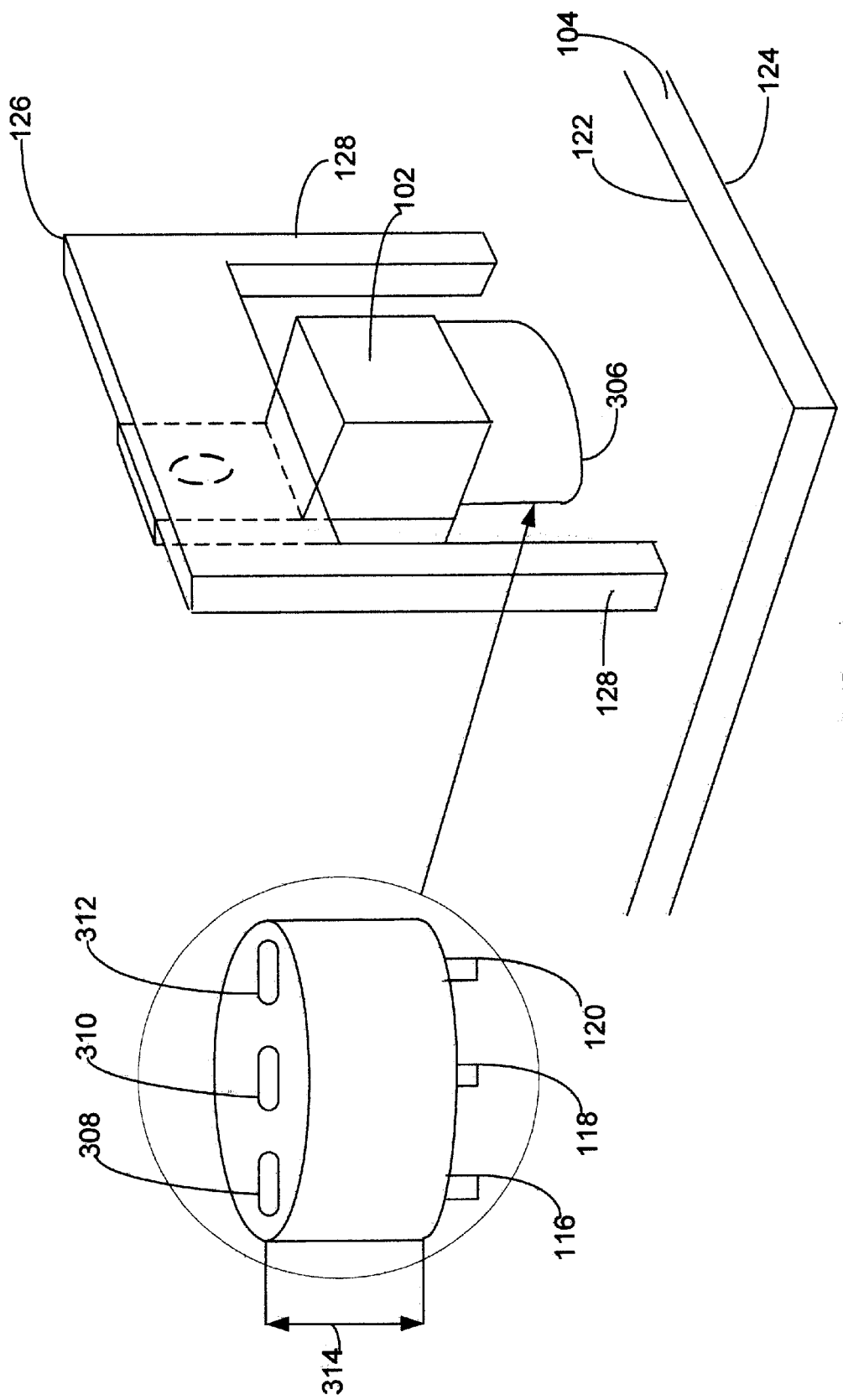
FIG. 4 illustrates a heat dissipation device that is installed onto the electrical component either before or after an elastomer shape cut by a punch die is installed on the leads of the electrical component prior to placement on a substrate.

FIG. 4 illustrates a heat dissipation device 126 that is installed onto the electrical component 102 either before or after an elastomer shape 306 cut by a punch die is slipped over the leads of the electrical component 102 prior to placement on the substrate 104. The heat dissipation device 126 usually has tabs 128 that protrude through the substrate 104 (if the substrate 104 is a through-hole substrate) that are soldered at the same time as the leads 116, 118, and 120. The heat dissipation device 126 can be used as the fixture to compress the elastomer shape 306 prior to soldering, and thereby eliminate the need for a fixture. Once the electrical component 102 and heat dissipation device 126 are soldered to the substrate 104, the leads 116, 118, and 120 are trimmed flush to the bottom surface 124 of the substrate 104.

Figure 5:
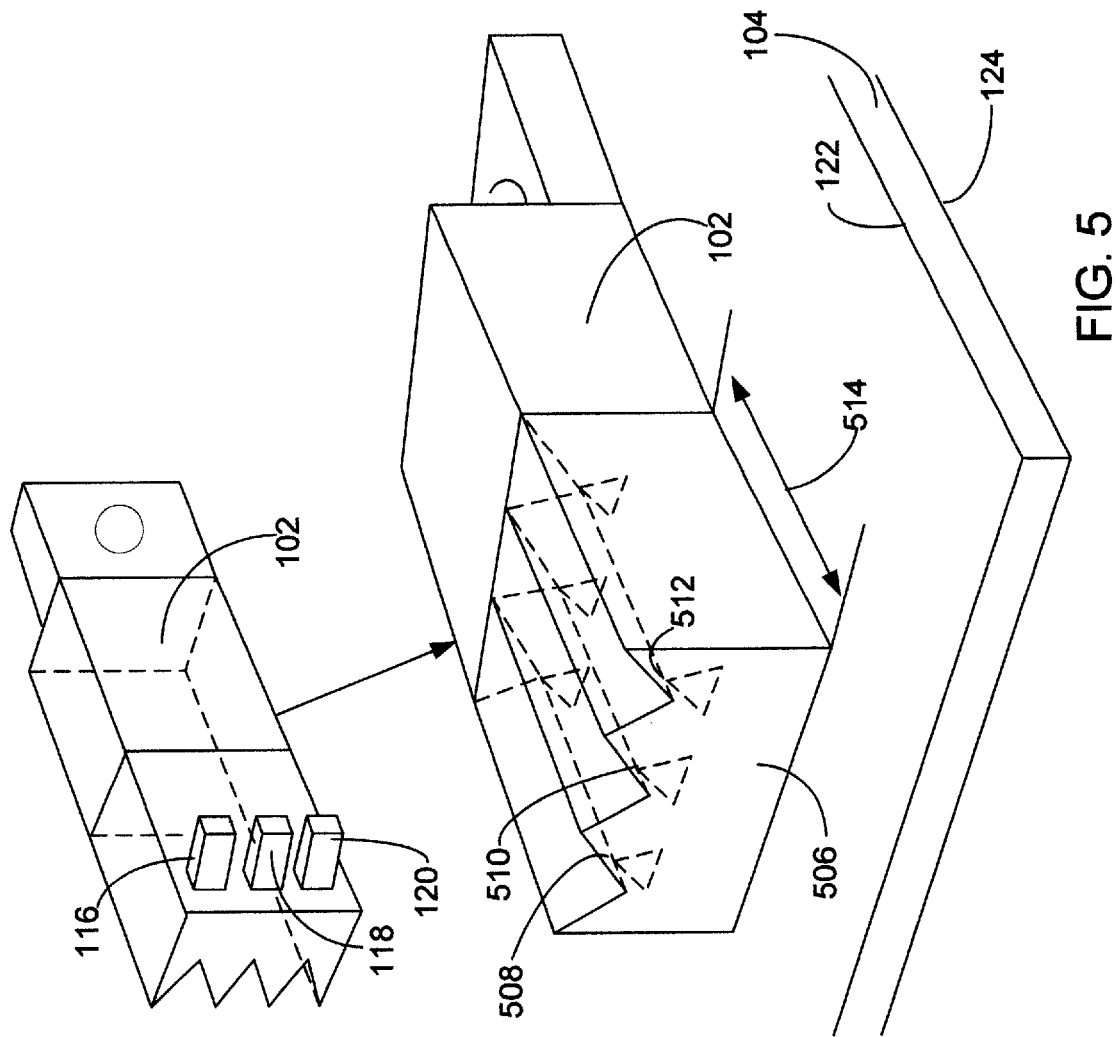
FIG. 5 illustrates one embodiment of the invention applied to an electrical component (e.g., a power semiconductor) that is horizontally placed on a substrate.

FIG. 5 illustrates one embodiment of the invention applied to an electrical component 102 (e.g., a power semiconductor) that is horizontally placed on a substrate 104 (e.g. a PCB). The electrical component leads 116, 118, and 120 are bent at a 90-degree angle for placement on the substrate 104. Electrical component 102 includes an elastomer part 506 comprising a soft, compliant plastic or rubber (e.g., silicone rubber). Elastomer part 506 has a plurality of grooves (e.g., grooves 508, 510, and 512) of equal length 514 that surround each lead 116, 118, and 120, respectively, after they are pushed into the grooves. A plurality of through-holes or slots (not shown) are provided near the far end of the elastomer part 506 to accommodate the leads 116, 118, and 120 as they bend 90-degrees and perpendicular to the substrate 104. The grooves 508, 510, and 512 are designed to close at the top once the electrical component 102 is placed into the elastomer part 506 and they are both placed on the substrate 104. In this embodiment, no precompression is necessary prior to the soldering process. The seal to the body of the electrical component 102 is accomplished by sizing the elastomer part 506 so that the bend in the semiconductor leads 116, 118, and 120 provides a light sealing force against the body of the electrical component 102.

Figure 6:
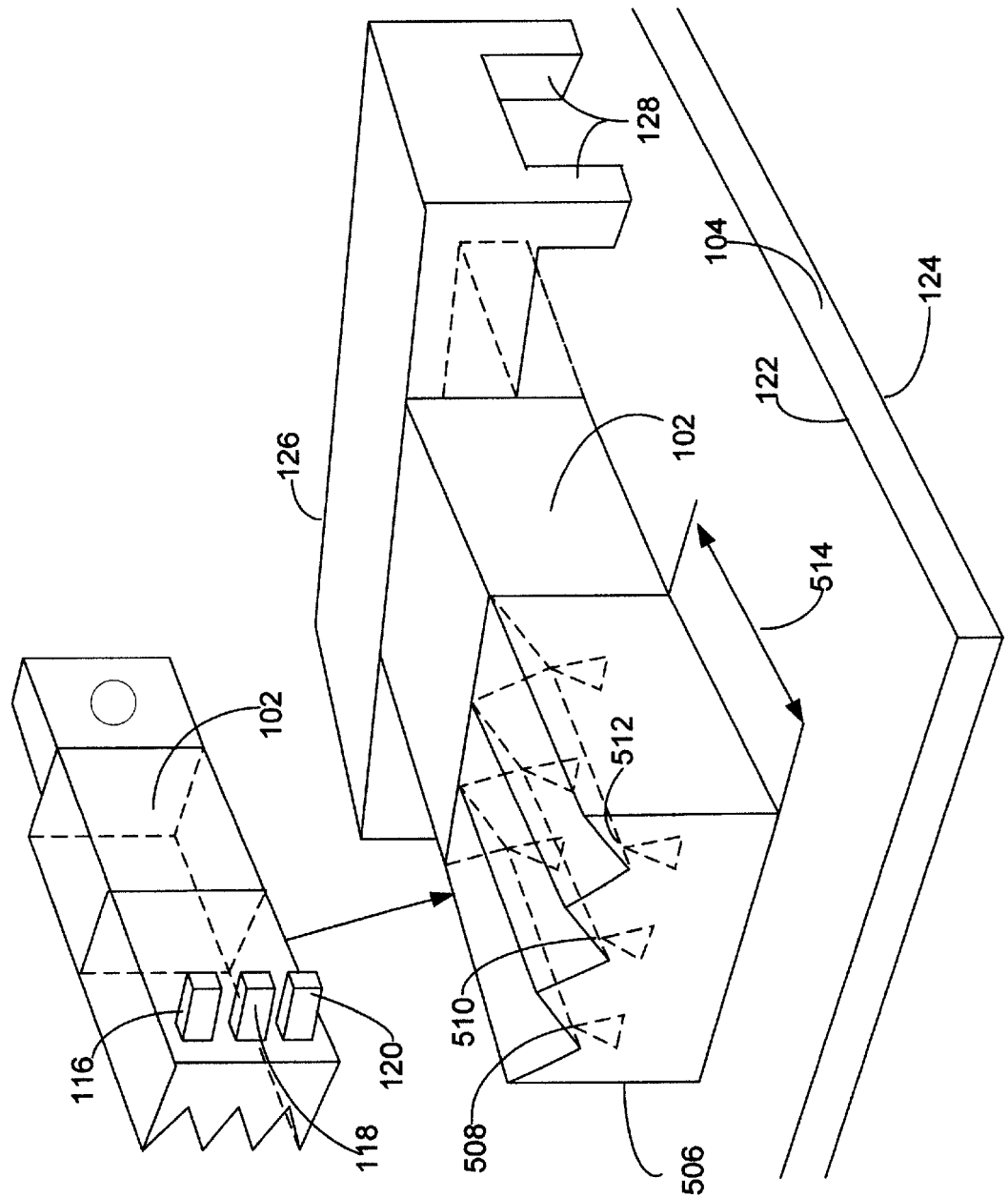
FIG. 6 illustrates an electrical component, an elastomer part, and a heat dissipation device that is installed onto the electrical component prior to placement on a substrate.

FIG. 6 illustrates an electrical component 102, an elastomer part 506, and a heat dissipation device 126 that is installed onto the electrical component 102 prior to placement on the substrate 104. The heat dissipation device 126 usually has tabs 128 that protrude through the substrate 104 (if the substrate 104 is a through-hole substrate) that are soldered at the same time as the leads 116, 118, and 120. The heat dissipation device 126 can be used as the fixture to compress the elastomer part 506 prior to soldering, and thereby eliminate the need for using a fixture. As discussed above, if the substrate 104 is a through-hole substrate, the leads 116, 118, and 120 can be trimmed flush to the bottom surface 124 of the substrate 104.

Figure 7:
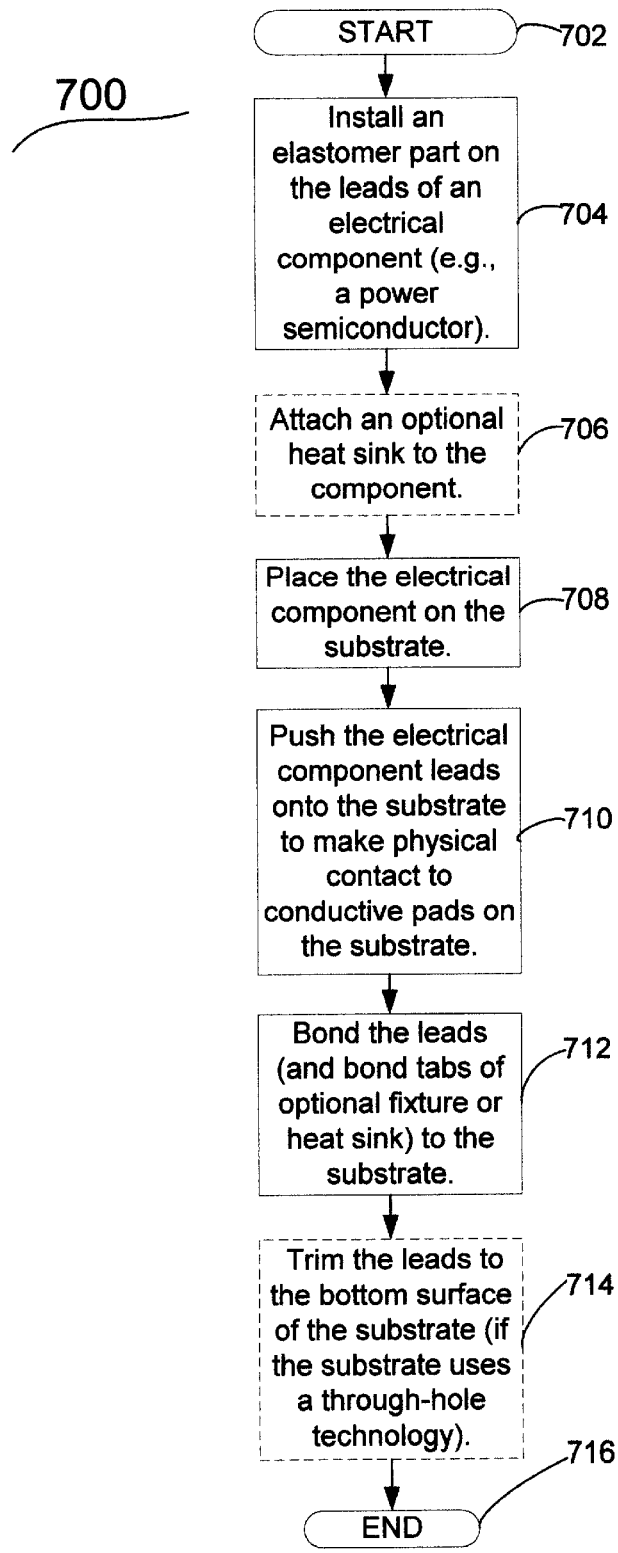
FIG. 7 shows one flow chart for a method to use an elastomer part around the leads of an electrical component (e.g., a power semiconductor) shown in FIG. 1 in accordance with one embodiment of the present invention.

FIG. 7 shows one flow chart 700 for a method to use an elastomer part around the leads of an electrical component (e.g., a power semiconductor) assembled to a substrate shown in FIG. 1 in accordance with one embodiment of the present invention. The method starts in operation 702, and is followed by operation 704. In operation 704, an elastomer part is installed on the leads of an electrical component. In optional operation 706, a heat dissipation device is attached to the electrical component. In alternative embodiments of the invention, the attachment of a heat dissipation device in optional operation 706 can precede the installation of the elastomer part on the leads of an electrical component. In operation 708, the electrical component is placed on a substrate (e.g., a PCB or other equivalent substrate). Then operation 710 is next, where the electrical component leads are pushed down onto the substrate to make physical connection to the conductive contacts of the substrate. Then operation 712 is next, in which the leads of the electrical component (and the tabs of an optional fixture or heat dissipation device) are bonded (e.g., soldered) to the substrate. In optional operation 714, the leads of the electrical component are trimmed to the bottom surface of a substrate using through-hole technology. Operation 716 is the end of the method.

Figure 8:
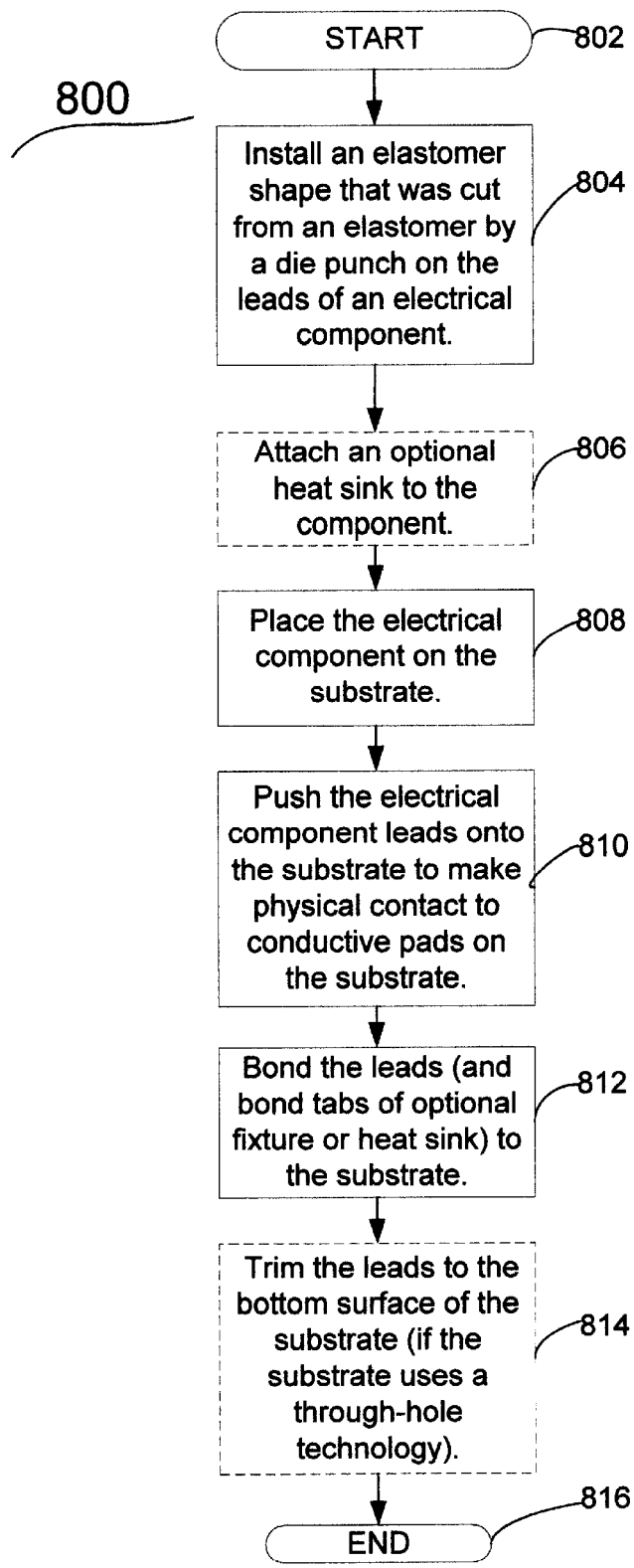
FIG. 8 shows one flow chart for a method to use a punch die elastomer around the leads of an electrical component shown in FIG. 3 in accordance with one embodiment of the present invention.

FIG. 8 shows one flow chart 800 for a method to use an elastomer shape that was cut by punch die around the leads of an electrical component assembled on a substrate shown in FIG. 3 in accordance with one embodiment of the present invention. The method starts in operation 802, and is followed by operation 804. In operation 804, an elastomer shape that was cut by a punch die in an appropriate shape (e.g., an oval, a circle, a rectangle, or other shape), with separate holes for receiving the leads of an electrical component, is installed on the leads of an electrical component. In optional operation 806, a heat dissipation device is attached to the electrical component. In alternative embodiments of the invention, the attachment of a heat dissipation device in optional operation 806 can precede the installation of the elastomer shape on the leads of an electrical component. In operation 808, the electrical component is placed on a substrate (e.g., a PCB or other equivalent substrate). Then operation 810 is next, where the electrical component leads are pushed down onto the substrate to make physical connection to the conductive contact (e.g., through-holes or pads) of the substrate. Then operation 812 is next. In operation 812, the leads of the electrical component (and the tabs of an optional fixture or heat dissipation device) are bonded (e.g., soldered) to the substrate. In optional operation 814, the leads of the electrical component are trimmed to the bottom surface of a substrate using through-hole technology. Operation 816 is the end of the method.

Figure 9:
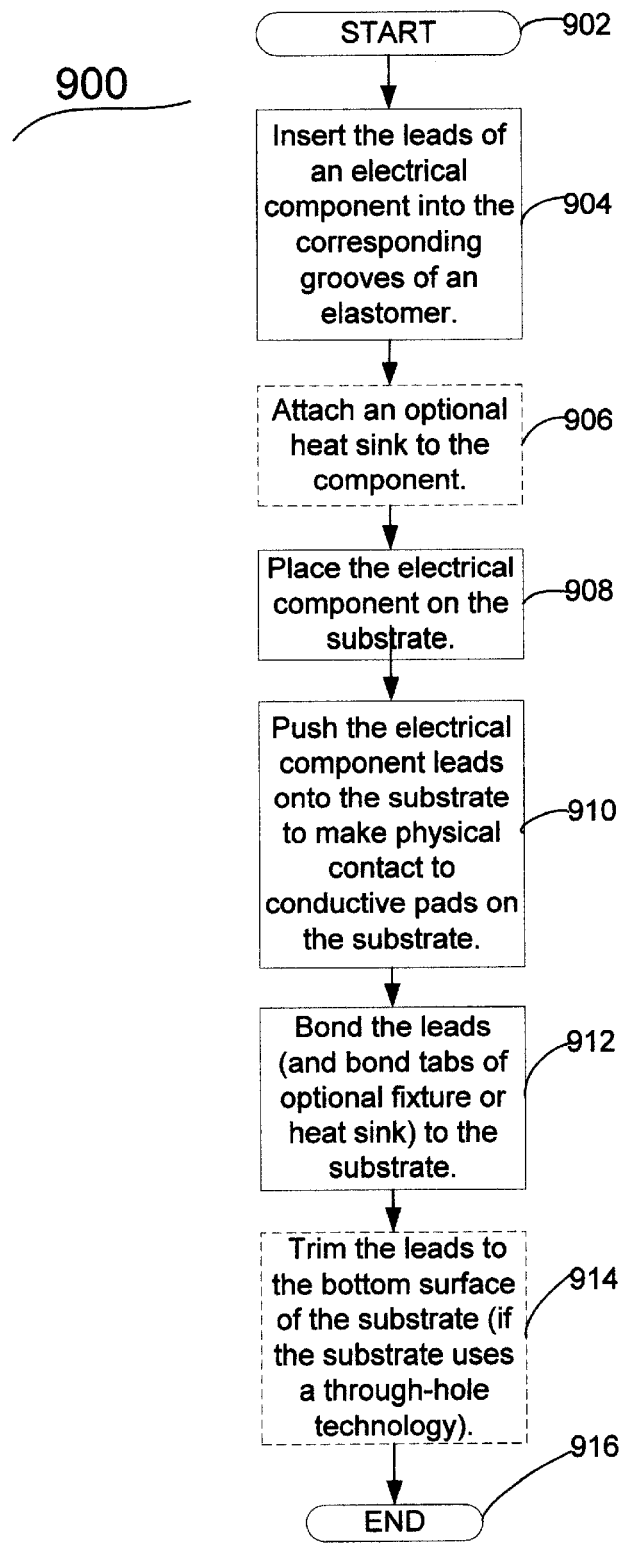
FIG. 9 shows one flow chart for a method to use an elastomer part around the bent leads of an electrical component shown in FIG. 5 in accordance with one embodiment of the present invention.

FIG. 9 shows one flow chart 900 for a method to use an elastomer part around the bent leads of an electrical component assembled on a substrate shown in FIG. 5 in accordance with one embodiment of the present invention. The method starts in operation 902, and is followed by operation 904. In operation 904, the leads of an electrical component are pushed into a corresponding number of grooves in an elastomer (e.g., a soft, compliant plastic or rubber, such as silicon rubber that closes at the top of the groove after the leads are pushed into the elastomer part). In optional operation 906, a heat dissipation device is attached to the electrical component. In alternative embodiments of the invention, the attachment of a heat dissipation device in optional operation 906 can precede the installation of the elastomer part on the leads of an electrical component. In operation 908, the assembly is placed on a substrate (e.g., a PCB or other equivalent substrate). Then operation 910 is next, where the electrical component leads are pushed down onto the substrate to make physical connection to the conductive contacts of the substrate. Then operation 912 is next. In operation 912, the leads of the electrical component (and the tabs of an optional fixture or heat dissipation device) are bonded (e.g., soldered) to the substrate. In optional operation 914, the leads are trimmed to the bottom surface if the substrate uses through-holes.

Embodiments of the invention can use elastomers that are molded, extruded and cut, stamped from a sheet by a punch die, or fabricated by other equivalent processes. The desired durometer hardness of the elastomer can determine the preferred process of fabrication. Some of the various embodiments of the invention can use elastomers with a durometer hardness ranging from less than 20 to more than 90. However, an elastomer having a durometer hardness ranging from approximately 20 to approximately 50 is likely to be more practical in a manufacturing environment. One manufacturing consideration is that a relatively soft elastomer having a low durometer hardness will stick more easily to the leads of the electrical component than a relatively hard elastomer having a high durometer hardness. Therefore, a relatively hard elastomer can slip-off the leads of an electrical component, unless the elastomer is installed on the leads immediately prior to the placement of the electrical component on a substrate.

Preferred embodiments of the invention use an elastomer that has a chemical composition that is substantially free of halides (e.g., chlorides), otherwise halide-induced corrosion of the leads of an electrical component could be a reliability issue. Preferred embodiments of the invention use an elastomer that is chemically resistant or impervious to ozone (generated by high voltages), solder fluxes, and substrate cleaning solvents (both hydrocarbon-based solvents and water-based solvents).

The compliancy of the elastomer in sealing the leads can be primarily determined by the elastomer having a relatively low durometer hardness, or primarily determined by the mechanical shape of the elastomer (e.g., the dimensional aspects of the grooves in the elastomer part discussed for FIG. 9). One embodiment of the invention can use an elastomer that provides a minimum elastomer encapsulation thickness of approximately 80 mils (0.20 centimeters) around the leads of an electrical component. However, other embodiment of the invention can use an elastomer that provides a minimum elastomer encapsulation thickness that is either less than 80 mils (0.20 centimeters), or greater than 80 mils (0.20 centimeters).

The amount of applied pressure necessary to seal the elastomer around the leads of the electrical component during the bonding process to the substrate will also be strongly dependent on the durometer hardness and encapsulation thickness of the elastomer. A relatively soft elastomer with a relatively thin encapsulation thickness may not require a fixture to push the electrical component on the substrate during the bonding process, if the weight of the electrical component provides sufficient pressure on the elastomer. A relatively hard elastomer with a relatively thick encapsulation thickness may require a fixture to push the electrical component on the substrate during the bonding process, if the weight of the electrical component does not provides sufficient pressure on the elastomer.

The embodiments of the invention discussed above were directed to electrical components, such as power semiconductors with three lead packages. However, alternative embodiments of the invention can be applied to electrical components with a greater or lesser number of leads, and can be applied to electrical components other than power semiconductors. Embodiments of the invention can be applied to electrical component leads in a line on a single plane, or applied to electrical component leads in multiple lines on parallel planes (e.g., a dual inline package). Additionally, various embodiments of the invention can be applied to PCBs using through-hole technology or surface mount technology, or other types of electrical component substrates (e.g., multi-chip modules). Alternative embodiments of the invention can also be applied to electrical components with leads of any arbitrary curvature, and are not limited to straight leads or leads bent at a 90-degree angle.

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method for assembling an electrical component onto a substrate, the electrical component having a plurality of leads, the substrate having a plurality of conductive contacts, the method comprising:

installing a compliant elastomer part on said plurality of leads of said electrical component to substantially encapsulate said plurality of leads, wherein the compliant elastomer part is installed on the plurality of leads prior to coupling the electrical component and the elastomer part to the substrate;

after installing the elastomer part on said plurality of leads, pushing said plurality of leads onto said plurality of conductive contacts of said substrate so that the elastomer part prevents exposure of said plurality of leads;

compressing the compliant elastomer part by the electrical component and substrate, when the leads are pushed onto the conductive contacts of the substrate, so that the compliant elastomer part completely encapsulates the leads and provides a consistent particle-tight seal at a body of the electrical component and a surface of the substrate; and bonding said plurality of leads of said electrical component onto said plurality of conductive contacts to form a plurality of electrical connections between said plurality of leads and said plurality of conductive contacts, where the elastomer part provides the consistent particle-tight seal around each of said plurality of leads and eliminates particle contamination by airborne filaments between adjacent leads in said plurality of leads.

2. The method of claim 1, wherein said substrate is a printed circuit board (PCB).

3. The method of claim 2, wherein said plurality of conductive contacts of said PCB comprise a plurality of through-holes.

4. The method of claim 1, further comprising:
attaching a heat dissipation device to said electrical component before pushing said plurality of leads of said electrical component onto said plurality of conductive contacts of said substrate.

5. The method of claim 4, further comprising:
bonding one or more tabs of said heat dissipation device onto said substrate.

6. The method of claim 1, wherein said electrical component is a power semiconductor.

7. The method of claim 1, wherein said elastomer part has a plurality of grooves and said plurality of leads are pushed into said plurality of grooves to substantially encapsulate said plurality of leads before pushing said plurality of leads onto said plurality of conductive contacts of said substrate.

8. The method of claim 1, wherein said bonding of said plurality of leads of said electrical component, onto said plurality of conductive contacts includes re-flowing a solder compound to electrically connect said plurality of leads of said electrical component: onto said plurality of conductive contacts.

9. The method of claim 1, wherein a length of the elastomer part is specified to be longer than a distance between the electrical component and the substrate.

10. The method of claim 1, wherein the leads include portions that are exposed, after installing the elastomer part on the leads; and wherein the portions are for placement on the substrate.

11. The method of claim 1, further comprising:
trimming the leads after bonding the leads onto the conductive contacts.

12. The method of claim 1, wherein the leads are not exposed after pushing the leads onto the conductive contacts.

13. The method of claim 1, wherein the leads are soldered to the conductive contacts on the substrate, so that the leads are not removable from the conductive contacts.

14. A method for assembling an electrical component onto a substrate, the electrical component having a plurality of leads, the substrate having a plurality of conductive contacts, the method comprising:
installing a compliant elastomer part on said plurality of leads of said electrical component to substantially encapsulate said plurality of leads, wherein the compliant elastomer part is installed on the plurality of leads prior to coupling the electrical component and the elastomer part to the substrate;

after installing the elastomer part on said plurality of leads, pushing said plurality of leads onto said plurality of conductive contacts of said substrate so that the elastomer part prevents exposure of said plurality of leads;

compressing the compliant elastomer part by the electrical component and the substrate, when the leads are pushed onto the conductive contacts of the substrate, so that the compliant elastomer part completely encapsulates the leads and provides a consistent particle-tight seal at a body of the electrical component and a surface of the substrate; and bonding said plurality of leads of said electrical component onto said plurality of conductive contacts, where the elastomer part provides the consistent particle-tight seal around each of said plurality of leads and eliminates particle contamination by airborne filaments between adjacent leads in said plurality of leads.

15. The method of claim 14, wherein said substrate is a printed circuit board (PCB).

16. The method of claim 15, wherein said plurality of conductive contacts of said PCB comprise a plurality of through-holes.

17. The method of claim 14, further comprising:
attaching a heat dissipation device to said electrical component before pushing said plurality of leads of said electrical component onto said plurality of conductive contacts of said substrate.

18. The method of claim 17, further comprising:
bonding one or more tabs of said heat dissipation device onto said substrate.

19. The method of claim 14, wherein said electrical component is a power semiconductor.

20. The method of claim 14, wherein said elastomer part has a plurality of grooves and said plurality of leads are pushed into said plurality of grooves to substantially encapsulate said plurality of leads before pushing said plurality of leads onto said plurality of conductive contacts of said substrate.

21. The method of claim 14, wherein said bonding, of said plurality of leads of said electrical component onto said plurality of conductive contacts includes reflowing a solder compound to electrically connect said plurality of leads of said electrical component onto said plurality of conductive contacts.

22. The method of claim 14, wherein a length of the elastomer part is specified to be longer than a distance between the electrical component and the substrate.

23. The method of claim 14, wherein the leads include portions that are exposed, after installing the elastomer part on the leads; and wherein the portions are for placement on the substrate.

24. The method of claim 14, further comprising:
trimming the leads after bonding the leads onto the conductive contacts.

25. The method of claim 14, wherein the leads are not exposed after pushing the leads onto the conductive contacts.

26. The method of claim 14, wherein the leads are soldered to the conductive contacts on the substrate, so that the leads are not removable from the conductive contacts.

27. A method for assembling an electrical component onto a substrate, the method comprising:

installing a compliant elastomer part on a plurality of leads of an electrical component, in order to substantially encapsulate the leads, wherein the compliant elastomer part is installed on the plurality of leads prior to coupling the electrical component and the elastomer part to the substrate;

after installing the elastomer part on the leads, pushing the leads onto a plurality of conductive contacts of the substrate;

compressing the compliant elastomer part by the electrical component and the substrate, when the leads are pushed onto the conductive contacts of the substrate, so that the compliant elastomer part completely encapsulates the leads and provides a seal at a body of the electrical component and a surface of the substrate; and bonding the leads onto the conductive contacts.

28. The method of claim 27, wherein the substrate is a printed circuit board (PCB).

29. The method of claim 28, wherein the plurality of conductive contacts of the PCB comprises a plurality of through-holes.

30. The method of claim 27, further comprising:

attaching a heat dissipation device to the electrical component before pushing the leads of the electrical component onto the conductive contacts of the substrate.

31. The method of claim 30, further comprising:

bonding at least one tab of the heat dissipation device onto the substrate.

32. The method of claim 27, wherein the electrical component is a power semiconductor.

33. The method of claim 27, wherein said elastomer part has a plurality of grooves and said plurality of leads are pushed into said plurality of grooves to substantially encapsulate said plurality of leads before pushing said plurality of leads onto said plurality of conductive contacts of said substrate.

34. The method of claim 31, wherein said bonding of said plurality of leads of said electrical component onto said plurality of conductive contacts includes re-flowing a solder compound to electrically connect said plurality of leads of said electrical component onto said plurality of conductive contacts.

35. The method of claim 27, wherein a length of the elastomer part is specified to be longer than a distance between the electrical component and the substrate.

36. The method of claim 27, wherein the leads include portions that are exposed, after installing the elastomer part on the leads; and wherein the portions are for placement on the substrate.

37. The method of claim 27, further comprising:

trimming the leads after bonding the leads onto the conductive contacts.

38. The method of claim 27, wherein the leads are not exposed after pushing the leads onto the conductive contacts.

39. The method of claim 27, wherein the leads are soldered to the conductive contacts on the substrate, so that the leads are not removable from the conductive contacts.

* * * * *